US011930707B2

United States Patent
Hatasako et al.

(10) Patent No.: US 11,930,707 B2
(45) Date of Patent: Mar. 12, 2024

(54) THERMOELECTRIC POWER GENERATION DEVICE (71) Applicant: Yanmar Co., Ltd., Osaka (JP)

(72) Inventors: Yoshika Hatasako, Osaka (JP); Jiro Fukudome, Osaka (JP); Yuichiro Tanaka, Osaka (JP); Shuichi Nakagawa, Osaka (JP)

(73) Assignee: YANMAR CO., LTD., Osaka (JP)

( * ) Notice: Subject to any disclaimer, the term of this patent is extended or adjusted under 35 U.S.C. 154(b) by 969 days.

(21) Appl. No.: 16/304,086

(22) PCT Filed: May 9, 2017

(86) PCT No.: PCT/JP2017/017562
§ 371 (c)(1),
(2) Date: Nov. 21, 2018

(87) PCT Pub. No.: WO2017/203973
PCT Pub. Date: Nov. 30, 2017

(65) Prior Publication Data
US 2020/0343430 A1    Oct. 29, 2020

(30) Foreign Application Priority Data

May 25, 2016    (JP) .................................. 2016-104246

(51) Int. Cl.
*H10N 10/13*    (2023.01)
*F01N 3/02*    (2006.01)
(Continued)

(52) U.S. Cl.
CPC ........... *H10N 10/13* (2023.02); *F01N 3/0205* (2013.01); *F01N 5/025* (2013.01); *F25B 21/02* (2013.01);
(Continued)

(58) Field of Classification Search
CPC .............. H01L 35/00–34; H01L 27/16; H10N 10/00–857
(Continued)

(56) References Cited

U.S. PATENT DOCUMENTS

| 2,947,150 A | * | 8/1960 | Roeder, Jr. | ............... | F25B 21/02 |
| | | | | | 165/104.21 |
| 5,409,547 A | * | 4/1995 | Watanabe | ............... | H01L 35/32 |
| | | | | | 136/224 |

(Continued)

FOREIGN PATENT DOCUMENTS

| CN | 201093907 | * | 7/2008 | | |
| DE | 102008005334 A1 | * | 7/2009 | ............. | F01N 5/025 |

(Continued)

OTHER PUBLICATIONS

English translation for JP2002272152 (Year: 2002).*

(Continued)

*Primary Examiner* — Bach T Dinh
(74) *Attorney, Agent, or Firm* — NORTON ROSE FULBRIGHT US LLP (57) ABSTRACT

A thermoelectric power generation device including a thermoelectric element having a first side provided to a heating unit and a second side provided to a cooling unit, and a heat transfer pipe arranged in a passage in which a high temperature fluid flows. The heating unit and the heat transfer pipe have internal spaces communicating with each other. The internal space of the heating unit and the internal space of the heat transfer pipe form a circulation path in which a heat medium is circulated. An outlet of the heat transfer pipe from which the heat medium is discharged is provided in a position higher than an inlet of the heat transfer pipe into which the heat medium flows. The heat transfer pipe vaporizes the heat medium flowing in the circulation path by using (Continued)

heat of the high temperature fluid. The heating unit condenses the heat medium vaporized.

18 Claims, 7 Drawing Sheets

(51) Int. Cl.
*F01N 5/02* (2006.01)
*F25B 21/02* (2006.01)
*F28D 15/02* (2006.01)

(52) U.S. Cl.
CPC ...... *F28D 15/0266* (2013.01); *F01N 2240/02* (2013.01); *F01N 2240/22* (2013.01); *F25B 2500/01* (2013.01)

(58) Field of Classification Search
USPC .................................................. 136/200–242
See application file for complete search history.

(56) References Cited

U.S. PATENT DOCUMENTS

| | | | | |
|---|---|---|---|---|
| 2013/0333359 | A1* | 12/2013 | Resch | F28F 13/14 62/3.2 |
| 2015/0068575 | A1* | 3/2015 | Komitsu | F01N 5/025 136/212 |

FOREIGN PATENT DOCUMENTS

| | | | |
|---|---|---|---|
| GB | 981419 | A * | 1/1965 |
| JP | 1984-108085 | U | 7/1984 |
| JP | 07-159058 | A | 6/1995 |
| JP | 2002-272152 | A | 9/2002 |
| JP | 2005-083251 | A | 3/2005 |
| JP | 2013172576 | A | 9/2013 |
| RU | 41354 | U1 | 10/2004 |
| RU | 76428 | U1 | 9/2008 |

OTHER PUBLICATIONS

CN201093907 English translation (Year: 2008).*
DE-102008005334 English (Year: 2008).*
Japanese Office Action dated Nov. 12, 2019 issued in corresponding JP Application 2016-104246.
Russian Office Action dated Sep. 6, 2019 issued in corresponding RU Application 2018141233.
Russian Office Action (no date) issued in corresponding RU Application 2018141233.
International Search Report dated Jul. 25, 2017 issued in corresponding PCT Application PCT/JP2017/017562.

* cited by examiner

THERMOELECTRIC POWER GENERATION DEVICE

CROSS REFERENCES TO RELATED APPLICATIONS

This application is a national stage application pursuant to 35 U.S.C. § 371 of International Application No. PCT/JP2017/017562, filed on May 9, 2017 which claims priority under 35 U.S.C. § 119 to Japanese Patent Application No. 2016-104246 filed on May 25, 2016, the disclosures of which are hereby incorporated by reference in their entireties.

TECHNICAL FIELD

The present invention relates a thermoelectric power generation device.

BACKGROUND ART

Patent Literature 1 (hereinafter, PTL 1) discloses a thermoelectric power generation device configured to generate electric power by using temperature difference. In the device, a heat source unit whose heat source is the exhaust gas of an engine is provided on a high-temperature side of a thermoelectric element, and a coolant container on a low-temperature side of the thermoelectric element.

CITATION LIST

Patent Literature

PTL 1: Japanese Patent Application Laid-Open No. 2005-83251

SUMMARY OF INVENTION

Technical Problem

In recent years, there is a demand for improvement of power generation efficiency in a thermoelectric power generation device.

To achieve the above problem, it is an object of the present invention to provide a thermoelectric power generation device which can improve the power generation efficiency.

Solution to Problem

A thermoelectric power generation device related to an aspect of the present invention is
a thermoelectric power generation device including a thermoelectric element having a first side provided to a heating unit and a second side provided to a cooling unit, and
a heat transfer pipe arranged in a passage in which a high temperature fluid flows, wherein
the heating unit and the heat transfer pipe respectively have internal spaces communicating with each other,
the internal space of the heating unit and the internal space of the heat transfer pipe form a circulation path in which a heat medium is circulated,
an outlet of the heat transfer pipe from which the heat medium is discharged is provided in a position higher than an inlet of the heat transfer pipe into which the heat medium flows,
the inlet of the heat transfer pipe is provided in a position lower than a lowermost end portion of the thermoelectric element,
the heat transfer pipe vaporizes the heat medium flowing in the circulation path by using heat of the high temperature fluid, and
the heating unit condenses the heat medium vaporized.

Advantageous Effects of Invention

The thermoelectric power generation device of the aspects of the present invention as described above can improve the power generation efficiency.

DESCRIPTION OF EMBODIMENTS (Findings of Inventors)

The inventors of the present invention have developed a thermoelectric power generation device in which thermoelectric element is heated, in which the heat medium enclosed in a circulation path formed inside the heating unit and a heat transfer pipe spontaneously circulates, by having the heat medium alternately vaporized and condensed. In such a thermoelectric power generation device, the heat medium in the liquid form after condensation stays in the heating unit. This gave the inventors of the present invention a new problem that the heat medium in the form of liquid staying in the heating unit increases the resistance to transfer of heat to the thermoelectric element and inhibits generation of power by the thermoelectric element. To address this issue, the inventors of the present invention has reached an invention as described below.

A thermoelectric power generation device related to an aspect of the present invention is a thermoelectric power generation device including a thermoelectric element having a first side provided to a heating unit and a second side provided to a cooling unit, and a heat transfer pipe arranged in a passage in which a high temperature fluid flows, wherein the heating unit and the heat transfer pipe respectively have internal spaces communicating with each other, the internal space of the heating unit and the internal space of the heat transfer pipe form a circulation path in which a heat medium is circulated, an outlet of the heat transfer pipe from which the heat medium is discharged is provided in a position higher than an inlet of the heat transfer pipe into which the heat medium flows, the inlet of the heat transfer pipe is provided in a position lower than a lowermost end portion of the thermoelectric element, the heat transfer pipe vaporizes the heat medium flowing in the circulation path by using heat of the high temperature fluid, and the heating unit condenses the heat medium vaporized.

Since the above structure can suppress or reduce retention of the condensed heat medium in the internal space of the heating unit, an increase in the resistance to transfer of heat to the thermoelectric element due to the condensed heat medium can be suppressed or reduced. As a result, generation of power by the thermoelectric element is not inhibited by the condensed heat medium, and the power generation efficiency can be improved.

The above thermoelectric power generation device may be such that a slope for causing the heat medium flowing in the internal space of the heating unit to flow towards an outlet of the heating unit is provided at a bottom portion of the heating unit.

With this structure, the condensed heat medium flowing in the internal space of the heating unit flows to the outlet. Therefore, the heat medium condensed in the internal space of the heating unit is easily discharged to the heat transfer pipe. This suppresses or reduces retention of the condensed heat medium in the heating unit, and an increase in the resistance to transfer of heat to the thermoelectric element can be further suppressed or reduced.

The above thermoelectric power generation device may be such that the outlet of the heating unit is provided in a position higher than the inlet of the heat transfer pipe.

With this structure, the heat medium condensed in the heating unit can be easily discharged to the heat transfer pipe. This way, retention of the condensed heat medium in the internal space of the heating unit can be suppressed or reduced. Therefore, an increase in the resistance to transfer of heat to the thermoelectric element due to condensed heat medium can be suppressed or reduced, and the thermoelectric element can generate power without being inhibited by the condensed heat medium.

The above thermoelectric power generation device may be such that a liquid reservoir for storing the heat medium condensed in the heating unit is provided to a lower portion of the heating unit, and the liquid reservoir is connected to the outlet of the heating unit and the inlet of the heat transfer pipe.

With this structure, the heat medium condensed in the internal space of the heating unit can flow to the liquid reservoir. Therefore, retention of the condensed heat medium in the internal space of the heating unit can be suppressed or reduced. Therefore, an increase in the resistance to transfer of heat to the thermoelectric element due to condensed heat medium can be suppressed or reduced, and the thermoelectric element can generate power without being inhibited by the condensed heat medium.

The above thermoelectric power generation device may be such that a slope for causing the heat medium to flow towards the inlet of the heat transfer pipe is provided at a bottom portion of the liquid reservoir.

With this structure, the heat medium stored in the liquid reservoir is easily discharged to the heat transfer pipe. Therefore, retention of the condensed heat medium in the internal space of the heating unit can be suppressed or reduced.

The above thermoelectric power generation device may be such that the heating unit has a plurality of outlets at the bottom portion of the heating unit, and a connection pipe connecting the plurality of outlets of the heating unit with the inlet of the heat transfer pipe is provided in a lower portion of the heating unit.

With this structure, the heat medium condensed in the heating unit can flow from the plurality of outlets provided to the bottom portion of the heating unit to the inlet of the heat transfer pipe through the connection pipe. Therefore, retention of the condensed heat medium in the internal space of the heating unit can be suppressed or reduced. Therefore, an increase in the resistance to transfer of heat to the thermoelectric element due to condensed heat medium can be suppressed or reduced, and the thermoelectric element can generate power without being inhibited by the condensed heat medium.

The following describes embodiments with reference to attached drawings. In each of the drawings, elements are exaggerated for the sake of easier understanding.

Embodiment 1

[Overall Structure]

An overall structure of a thermoelectric power generation device related to Embodiment 1 is described.

Figure 1:
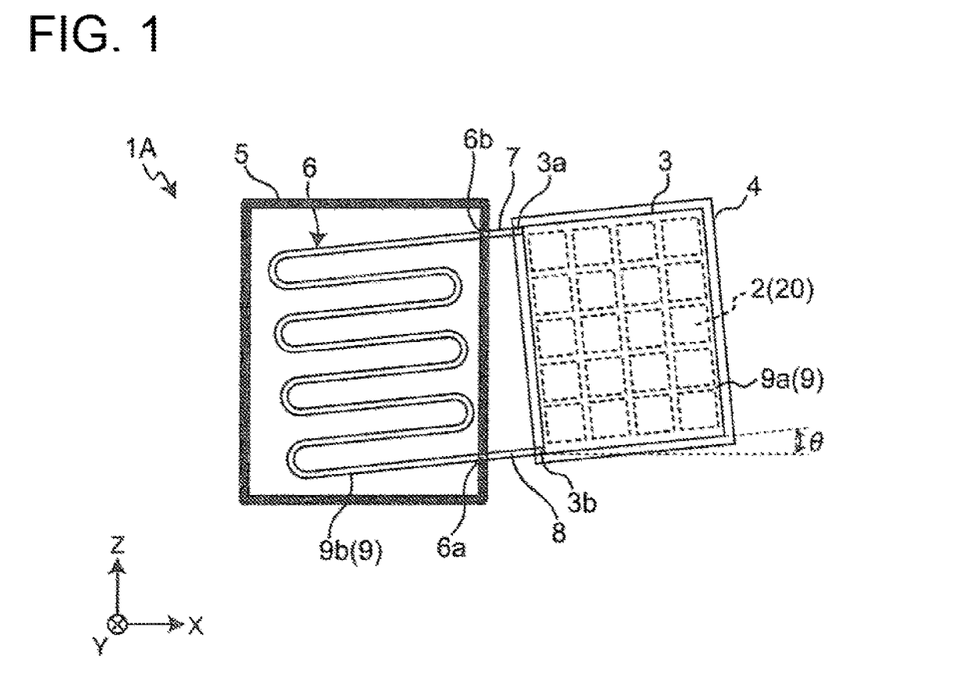
FIG. 1 is a diagram showing a schematic structure of a thermoelectric power generation device related to Embodiment 1 of the present invention.

FIG. 1 shows a schematic structure of a thermoelectric power generation device 1A related to Embodiment 1. The directions X, Y, and Z in FIG. 1 indicate the longitudinal direction, lateral direction, and the height direction of the thermoelectric power generation device 1A, respectively. The longitudinal direction, the lateral direction, and the height direction mean the length direction, short direction, and the up-down direction of the thermoelectric power generation device 1A, respectively.

As shown in FIG. 1, a thermoelectric power generation device 1A includes a thermoelectric element 2 having a first side provided to a heating unit 3 and a second side provided to a cooling unit 4. Further, the thermoelectric power generation device 1A includes a heat transfer pipe 6 arranged in a passage 5 in which a high temperature fluid flows. The heating unit 3 and the heat transfer pipe 6 have internal spaces 9a, 9b communicating with each other. The internal spaces 9a, 9b form a circulation path 9 in which the heat medium is circulated. An outlet 6b of the heat transfer pipe 6 from which the heat medium is discharged is provided in a position higher than an inlet 6a of the heat transfer pipe 6 into which the heat medium flows. The inlet 6a of the heat transfer pipe 6 is provided in a position lower than a lowermost end portion of the thermoelectric element 2.

In Embodiment 1, the heating unit 3 and the heat transfer pipe 6 are connected through a first connection pipe 7 through which heat medium flows in from the heat transfer pipe 6 to the heating unit 3 and a second connection pipe 8 through which the heat medium is discharged from the heating unit 3 to the heat transfer pipe 6. Further, the heating unit 3 and the heat transfer pipe 6 are inclined in the direction of gravity, when viewed from the Y direction.

<Thermoelectric Element>

The thermoelectric element 2 is an element having two surfaces, i.e., a first side (high-temperature side) to be provided on the heating unit 3, and a second side (low-temperature side) to be provided on the cooling unit 4. The thermoelectric element 2 generates power by utilizing a temperature difference caused by having its first side heated by the heating unit 3 while its second side cooled by the cooling unit 4. The thickness of the thermoelectric element 2 is designed to be smaller than the size (width) of the first side and the second side of the thermoelectric element 2. Specifically, the thermoelectric element 2 is formed in a plate shape. In Embodiment 1, thermoelectric modules 20 having a plurality of serially connected thermoelectric elements 2 are attached to the heating unit 3. Specifically, to the heating unit 3, the thermoelectric module 20 having 20 thermoelectric elements 2 of four columns x five rows is attached. The number of thermoelectric elements 2 is not limited to this. For example, the thermoelectric power generation device 1A may have a single thermoelectric element 2 attached to the heating unit 3.

<Heating Unit>

The heating unit 3 is made of a metal material with excellent thermal conductivity. The heating unit 3 is formed in a plate shape, which contacts first sides of the thermoelectric elements 2. The heating unit 3 and the heat transfer pipe 6 have internal spaces 9a, 9b communicating with each other. In the internal space 9a of the heating unit 3 and the internal space 9b of the heat transfer pipe 6, a heat medium is enclosed. Further, the internal space 9a of the heating unit 3 and the internal space 9b of the heat transfer pipe 6 form a circulation path 9 in which the heat medium is circulated. In Embodiment 1, the heating unit 3 is connected to the heat transfer pipe 6 through the first connection pipe 7 and the second connection pipe 8. The first connection pipe 7 and the second connection pipe 8 constitute a part of the circulation path 9.

The heat transfer pipe 6 vaporizes the heat medium flowing in the internal space 9b which is a part of the circulation path 9, by using the heat of the high temperature fluid flowing in the passage 5. That is, the heat transfer pipe 6 functions as a vaporizing unit for vaporizing the heat medium. The heating unit 3 condenses the heat medium vaporized in the internal space 9b of the heat transfer pipe 6. That is, the heating unit 3 functions as a heat medium condensing unit for condensing the heat medium. In Embodiment 1, water is used as the heat medium. Further, the passage 5 is an exhaust gas duct of an engine in which high-temperature exhaust gas flows. In the passage 5, the high temperature fluid flows in a direction towards the paper surface of FIG. 1A, i.e., in Y direction. The passage 5 may be, for example, a high-temperature environment such as an industrial waste furnace or a biomass boiler, or a radiation field not requiring convection, in addition to the exhaust gas duct of an engine.

Figure 2:
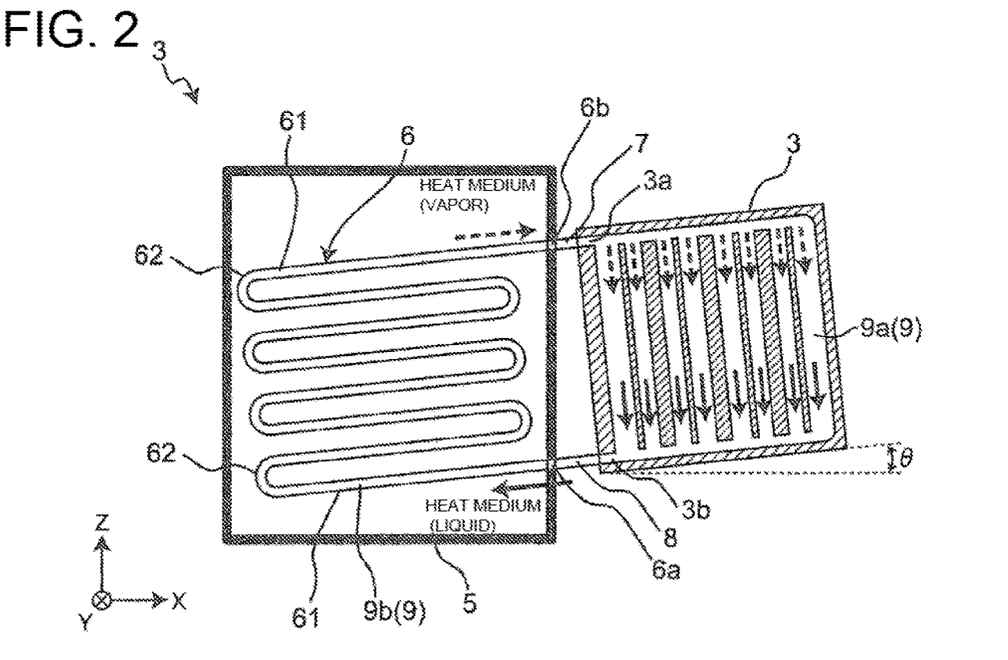
FIG. 2 is a diagram showing a schematic structure of a heating unit of the thermoelectric power generation device related to Embodiment 1 of the present invention.

FIG. 2 shows a schematic structure of the heating unit 3 and the heat transfer pipe 6 of the thermoelectric power generation device 1A. As shown in FIG. 2, in the heating unit 3, a heat medium passages are formed in such a manner that the heat medium spreads throughout the entire heating surface of the thermoelectric elements 2. Specifically, the inlet 3a into which the heat medium flows from the heat transfer pipe 6 through the first connection pipe 7 is provided in an upper portion of the heating unit 3. The outlet 3b from which the heat medium is discharged to the heat transfer pipe 6 through the second connection pipe 8 is provided in a lower portion of the heating unit 3. That is, the inlet 3a of the heating unit 3 is connected to the upstream side of the internal space 9a of the heating unit 3, and the outlet 3b of the heating unit 3 is connected to the downstream side of the internal space 9b of the heating unit 3. As a part of the circulation path 9, a plurality of heat medium passages extending in the Z direction are formed in the internal space 9a of the heating unit 3. The heat medium passages in the internal space 9a of the heating unit 3 may be, for example, inclined towards the X direction, as long as the heat medium flows in the direction of gravity.

In a bottom portion of the heating unit 3, a slope for causing the heat medium flowing in the internal space 9a of the heating unit 3 to flow towards the outlet 3b of the heating unit 3 is provided. Specifically, the bottom portion of the heating unit 3 is sloped at a predetermined angle θ so as to cause the heat medium in the internal space 9a of the heating unit 3 to flow towards the inlet 6a of the heat transfer pipe 6 through the second connection pipe 8. The predetermined angle θ is an angle at which the heating unit 3 is inclined in the direction of gravity when viewed from the Y direction, so that the condensed heat medium flows towards the outlet 3b of the heating unit 3. As described, by inclining the heating unit 3 in the direction of gravity so that the lower end of the heating unit 3 on the side of the heat transfer pipe 6 is lower than the lower end of the heating unit 3 on side opposite to the heat transfer pipe 6, when viewed from the Y direction, the condensed heat medium is discharged to the heat transfer pipe 6 through the second connection pipe 8 without being retained in the heating unit 3.

<Heat Transfer Pipe>

The heat transfer pipe 6 is arranged in the passage 5 in which the high temperature fluid flows, and vaporizes the heat medium flowing in the circulation path 9, by using the heat of the high temperature fluid. As shown in FIG. 2, the heat transfer pipe 6 is structured so as to have a large contact area with the high temperature fluid flowing in the passage 5 when viewed in the direction in which the high temperature fluid flows, i.e., the Y direction. Specifically, the heat transfer pipe 6 has a plurality of tubular members 61 extending in the X direction and a plurality of bent portions 62 connecting the tubular members 61 to each other, as viewed from the Y direction. The plurality of tubular members 61 are arranged with a predetermined interval in the Z direction and their end portions are connected through the bent portions 62, when viewed in the Y direction. With the plurality of tubular members 61 connected through the bent portions 62 as described, the heat transfer pipe 6 forms a continuous pipe having a plurality of bent portions.

In the passage 5 of Embodiment 1, the tubular member 61 on one end side of the heat transfer pipe 6 is structured to be longer than the tubular member 61 on the other end side. This way, the heat transfer pipe 6 is inclined in the direction of gravity. The tubular member 61 on one end side of the heat transfer pipe 6 is a tubular member arranged in the highest position relative to the height direction (Z direction). The tubular member 61 on the other end side of the heat transfer pipe 6 is a tubular member arranged in the lowest position relative to the height direction (Z direction).

The inlet 6a and the outlet 6b of the heat transfer pipe 6 are provided in a wall portion defining the passage 5. Specifically, the inlet 6a of the heat transfer pipe 6 is provided in a position where the tubular member 61 on the other end side is connected to the wall portion of the passage 5. Further, the outlet 6b of the heat transfer pipe 6 is provided in a position where the tubular member 61 on the one end side is connected to the wall portion of the passage 5. As described, the outlet 6b of the heat transfer pipe 6 is provided in a position higher than the inlet 6a.

The inlet 6a of the heat transfer pipe 6 is provided in a position lower than the lowermost end portion of the thermoelectric element 2. In Embodiment 1, the inlet 6a of the heat transfer pipe 6 is provided in a position lower than the lowermost end portion of a thermoelectric element 2 which is arranged in the lowest position in the thermoelectric module 20.

<First Connection Pipe>

The first connection pipe 7 is a pipe through which the heat medium flows from the heat transfer pipe 6 to the heating unit 3. Inside the first connection pipe 7, a heat medium passage in which the heat medium flows is formed. One end of the first connection pipe 7 is connected to the outlet 6b of the heat transfer pipe 6. The other end of the first connection pipe 7 is connected to the inlet 3a of the heating unit 3.

<Second Connection Pipe>

The second connection pipe 8 is a pipe through which the heat medium flows from the heating unit 3 to the heat transfer pipe 6. Inside the second connection pipe 8, a heat medium passage in which the heat medium flows is formed. One end of the second connection pipe 8 is connected to the inlet 6a of the heat transfer pipe 6. The other end of the second connection pipe 8 is connected to the outlet 3b of the heating unit 3.

Since Embodiment 1 deals with an example where the passage 5 is a rectangular exhaust gas duct as shown in FIG. 1, the wall surfaces of the passage 5 is flat. The inlet 6a and the outlet 6b of the heat transfer pipe 6 are provided in a flat wall surface (flat surface in the Z direction) of the passage 5. The first connection pipe 7 extends in the same direction as the direction in which the tubular member 61 on the one end side of the heat transfer pipe 6 is extended. The second connection pipe 8 extends in the same direction as the direction in which the tubular member 61 on the other end side of the heat transfer pipe 6 is extended. Further, the length of the second connection pipe 8 relative to the length direction (X direction) is longer than the length of the first connection pipe 7 relative to the length direction (X direction). Therefore, the distance between the heating unit 3 and the passage 5 in a portion where the second connection pipe 8 is provided (hereinafter, separation distance) is longer than the distance between the heating unit 3 and the passage 5 in the portion where the first connection pipe 7 is provided. With this structure, the heating unit 3 can be inclined in the direction of gravity. The slope for causing the heat medium to flow towards the outlet 3b of the heating unit 3 can be provided to the bottom portion of the heating unit 3 by inclining the heating unit 3 in the direction of gravity.

<Circulation Path>

The circulation path 9 is formed through the internal space 9a of the heating unit 3 and the internal space 9b of the heat transfer pipe 6. The heat medium circulates in the internal space 9a of the heating unit 3 and the internal space 9b of the heat transfer pipe 6. Specifically, when the heat transfer pipe 6 is heated by the high temperature fluid flowing in the passage 5, the liquid heat medium flowing in the internal space 9b of the heat transfer pipe 6 is turned into vapor. In other words, the heat medium is vaporized in the heat transfer pipe 6 and the phase of the heat medium changes from liquid to gas. The vapor flows from the tubular member 61 on the one end side of the heat transfer pipe 6 into the upstream side of the heat medium passage in the internal space 9a of the heating unit 3 through the first connection pipe 7. The vapor flowed into the upstream side of the heat medium passage in the internal space 9a of the heating unit 3 falls in the direction of gravity while being poured onto the heating surface of the heating unit 3, and is condensed by radiating heat from the heating surface to heat the thermoelectric elements 2. In other words, the phase of the heat medium changes from gas to liquid in the internal space 9a of the heating unit 3. The condensed vapor is discharged to the tubular member 61 on the other end side of the heat transfer pipe 6 through the second connection pipe 8 connected to the downstream side of the heat medium passage of the heating unit 3. The heat medium having discharged to the internal space 9b of the heat transfer pipe 6 is again heated by the high temperature fluid flowing into the passage 5, and the phase of the heat medium is changed from liquid to gas. As described, the heat medium spontaneously circulates in the circulation path 9 formed in the heating unit 3, the heat transfer pipe 6, the first connection pipe 7, and the second connection pipe 8. In other words, by using the phase change of the heat medium, the heat medium is repeatedly circulated in the circulation path 9 formed in the heating unit 3, the heat transfer pipe 6, the first connection pipe 7, and the second connection pipe 8, without power of a pump and the like.

<Cooling Unit>

The cooling units 4 are each made of a metal material with excellent thermal conductivity. The cooling units 4 are formed in a plate shape, which contact second sides of the thermoelectric elements 2. Further, inside each of the cooling units 4, a coolant passage in which a coolant flows is formed.

Figure 3:
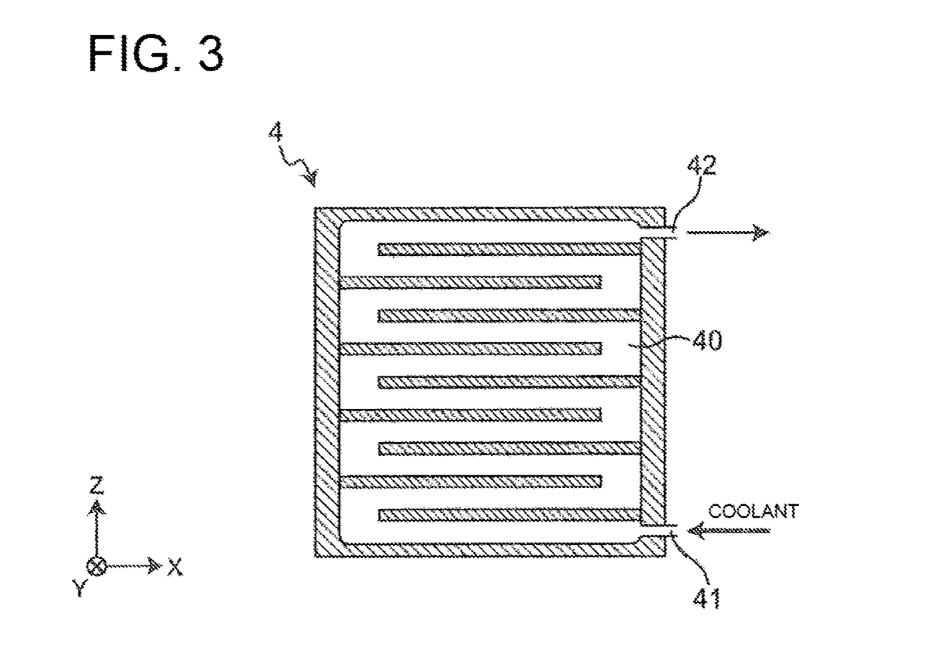
FIG. 3 is a diagram showing a schematic structure of a cooling unit of the thermoelectric power generation device related to Embodiment 1 of the present invention.

FIG. 3 shows a schematic structure of the cooling unit 4 of the thermoelectric power generation device 1A. As shown in FIG. 3, inside the cooling unit 4, a plate-shape coolant passage 40 is formed in such a manner that the coolant is spread throughout the entire cooling surface of the cooling unit 4 which contacts the thermoelectric element 2. Specifically, the coolant passage 40 has a plurality of passages extending in the X direction, which are connected with one another. The coolant passage 40 is provided with a coolant inflow pipe 41 on its low side, and a coolant discharge pipe 42 on its high side. The coolant having flowed from the coolant inflow pipe 41 into the coolant passage 40 cools the cooling surface in contact with the second side of the thermoelectric element 2, and then discharged from the coolant discharge pipe 42. Although the coolant passage 40 in Embodiment 1 is formed in a plate shape such that the coolant spreads throughout the entire cooling surface in contact with the thermoelectric element 2, the shape of the coolant passage 40 is not limited as long as the second side of the thermoelectric element 2 is entirely and evenly cooled. Further, the plurality of passages of the coolant passage 40 inside the cooling unit 4 may extend not only in the X direction but also in the Z direction. In Embodiment 1, water is used as the coolant.

<Electric System>

Figure 4:
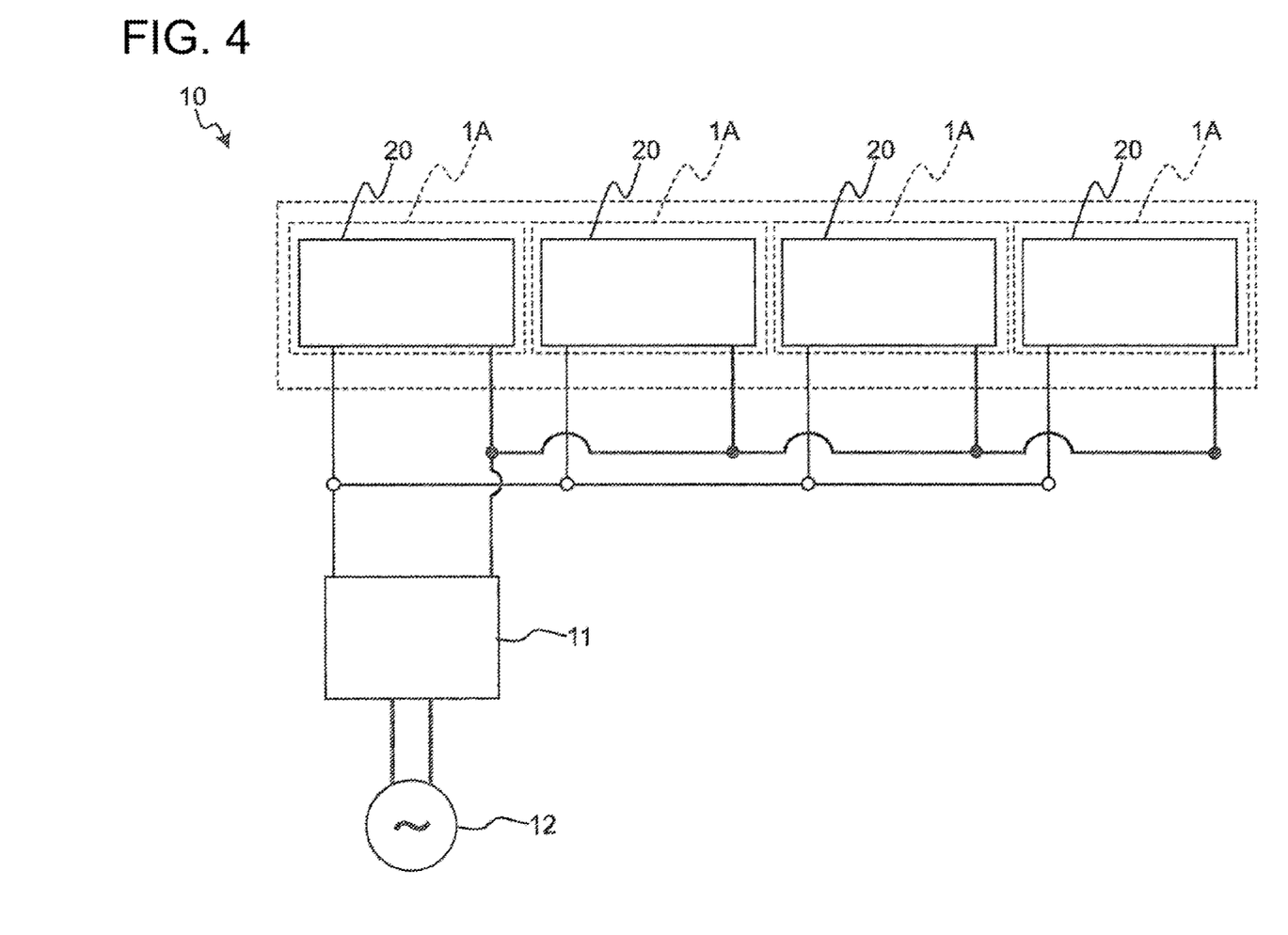
FIG. 4 is a schematic diagram of an electric system of a thermoelectric power generation system using the thermoelectric power generation device related to Embodiment 1 of the present invention.

FIG. 4 is a schematic diagram of an electric system of a thermoelectric power generation system 10 using the thermoelectric power generation device 1A. As shown in FIG. 4, the thermoelectric power generation system 10 includes: four thermoelectric power generation devices 1A, an inverter 11, and an electric load 12. In the thermoelectric power generation system 10, the four thermoelectric power generation devices 1A are connected in parallel. The four thermoelectric power generation devices 1A connected in parallel are connected to the inverter 11. The inverter 11 is connected to the electric load 12. In the thermoelectric power generation system 10, electric power generated by the four thermoelectric power generation devices 1A is supplied to the electric load 12 through the inverter 11.

<Heat Medium System>

Figure 5:
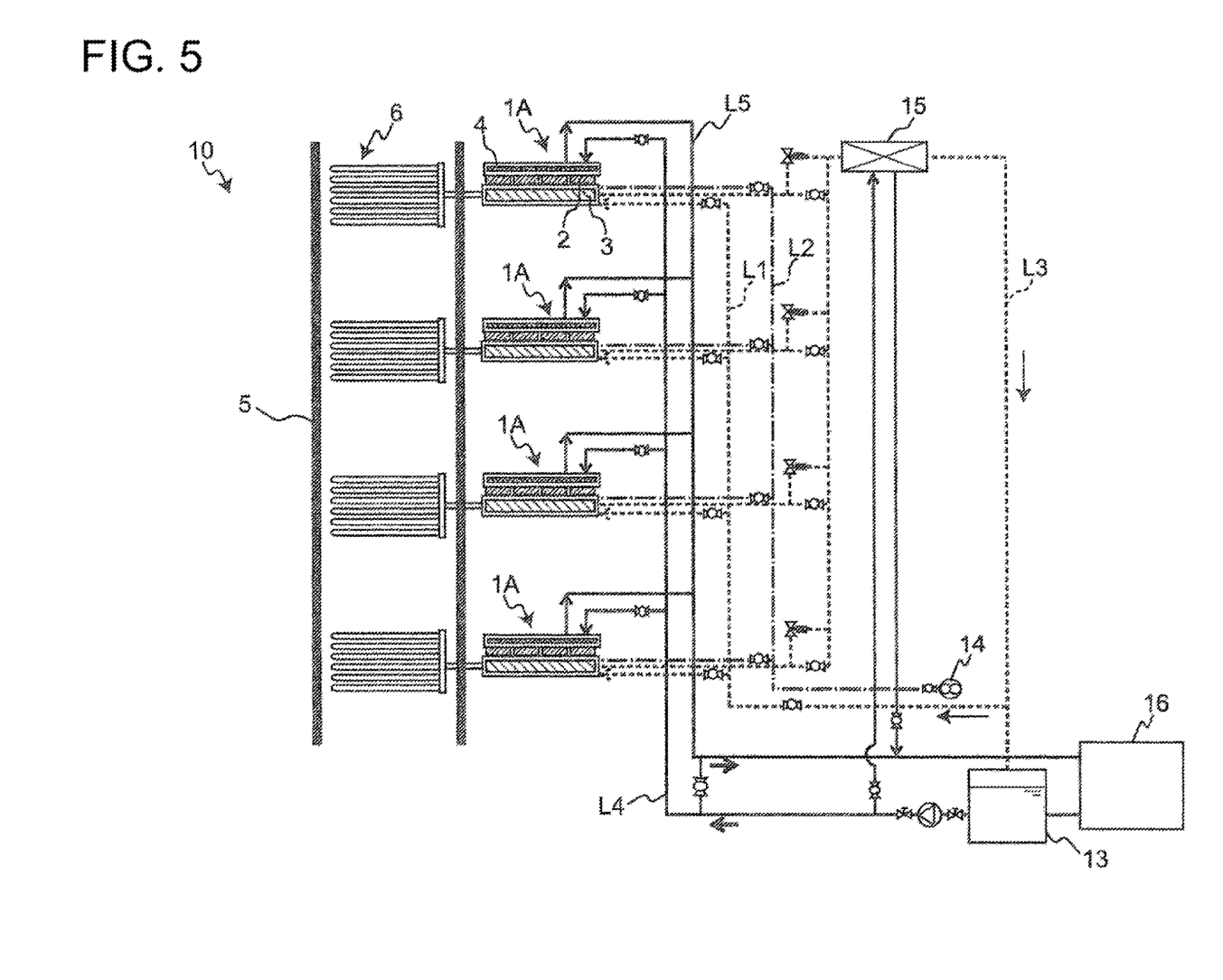
FIG. 5 is a schematic diagram of a heat medium system of the thermoelectric power generation system using the thermoelectric power generation device related to Embodiment 1 of the present invention.

FIG. 5 is a schematic diagram of a heat medium system of a thermoelectric power generation system 10 using the thermoelectric power generation device 1A. In FIG. 5, the dotted line indicates the line of the heat medium, and the solid line indicates the line of the coolant. First, a flow of the heat medium is described. As shown in FIG. 5, the heat medium lines L1, L2, L3 are connected to the heating units 3 of the thermoelectric power generation devices 1A. To the heat medium lines L1, L2, and L3, valves are provided respectively. While the heat medium spontaneously circulates inside the heating unit 3, the heat medium lines L1, L2, L3 are closed. The valve provided to the heat medium line L3 is a pressure valve.

The heat medium line L1 is a line for filling water to become the heat medium. To supply the heat medium inside the heating unit 3, the valve of the heat medium line L1 is opened to supply the heat medium from a tank 13 into the heating unit 3, through the heat medium line L1.

The heat medium line L2 is a line for evacuation using a vacuum pump 14. Evacuation is performed by using the vacuum pump 14 through the heat medium line L2, while the heating unit 3 has no heat medium. After the evacuation, the heat medium in the tank 13 is supplied inside the heating unit 3 through the heat medium line L1.

The heat medium line L3 is a line for discharging the heat medium inside the heating unit 3 to the tank 13. When the vapor pressure inside the heating unit 3 becomes higher than the tolerance of the pressure valve of the heat medium line L3, the pressure valve opens and the vapor inside the heating unit 3 is discharged to the heat medium line L3. The heat medium discharged from the heating unit 3 flows in the heat medium line L3, and is discharged to the tank 13 through a heat exchanger 15. Since water is used as the heat medium and as the coolant in Embodiment 1, the coolant and the heat medium can be stored in the tank 13.

Next, a flow of the coolant is described. As shown in FIG. 5, the coolant flows from the tank 13 to the cooling unit 4 through a coolant line L4, by using a pump and the like. The coolant having flowed into the cooling unit 4 flows to a cooling installation 16 through a coolant line L5. The cooling installation 16 is, for example, a cooling tower for cooling the coolant.

The coolant cooled in the cooling installation 16 is stored in the tank 13.

<Effects>

The thermoelectric power generation device 1A related to Embodiment 1 brings about the following effects.

In the thermoelectric power generation device 1A, the internal space 9a of the heating unit 3 and the internal space 9b of the heat transfer pipe 6 form a circulation path 9 in which the heat medium is circulated, the outlet 6b of the heat transfer pipe 6 is provided in a position higher than the inlet 6a of the heat transfer pipe 6, and the inlet 6a of the heat transfer pipe 6 is provided in a position lower than the lowermost end portion of the thermoelectric element 2. With this structure, the condensed heat medium in the internal space 9a of the heating unit 3 can be discharged from the heating unit 3 to the heat transfer pipe 6. Therefore, in the thermoelectric power generation device 1A, an increase in the resistance to transfer of heat to the thermoelectric element 2 due to condensed heat medium can be suppressed or reduced, and the thermoelectric element 2 can generate power without being inhibited by the condensed heat medium. As the result, the thermoelectric power generation device 1A can improve the power generation efficiency.

In the thermoelectric power generation device 1A, a slope for causing the heat medium flowing in the internal space 9a of the heating unit 3 to flow towards the outlet 3b of the heating unit 3 is provided at a bottom portion of the heating unit 3. With this structure, the condensed liquid heat medium flowed to the downstream side of the internal space 9a of the heating unit 3 is easily discharged from the outlet 3b of the heating unit 3 to the heat transfer pipe 6. Further, in Embodiment 1, the heat transfer pipe 6 is inclined towards the direction of gravity so that the heat medium is more easily discharged to the heat transfer pipe 6.

With the thermoelectric power generation device 1A, the heat medium can be circulated by phase changes in the circulation path 9 formed by the internal space 9a in the heating unit 3 and the internal space 9b in the heat transfer pipe 6. Therefore, the heat medium can be circulated without a power from a pump and the like, and reduction of costs and downsizing of the device can be achieved. Further, by using water as the heat medium and the coolant, the tank 13 can be used for storing both the heat medium and the coolant. Therefore, further reduction of costs and downsizing of the device can be achieved.

Although Embodiment 1 deals with a case where the thermoelectric element 2 is provided to one side of the heating unit 3, the present invention is not limited to this. For example, the thermoelectric element 2 may be provided on both sides of the heating unit 3, and the cooling unit 4 may be provided on both sides of the heating unit 3 so as to face each other across the thermoelectric elements 2. With this structure, heat on both sides of the heating unit 3 can be used for power generation by the thermoelectric elements 2. Therefore, power generation efficiency can be improved.

Although Embodiment 1 deals with a case where the heating unit 3 and the heat transfer pipe 6 are inclined in the direction of gravity, the present invention is not limited to this. The thermoelectric power generation device 1A may adopt any structure provided that the outlet 3b of the heating unit 3 is provided in a position lower than the lowermost end portion of the thermoelectric element 2. For example, while the heating unit 3 is inclined in the direction of gravity, the heat transfer pipe 6 does not have to be inclined.

Although Embodiment 1 deals with a case where the first connection pipe 7 extends in the direction in which the tubular member 61 on the one end side of the heat transfer pipe 6 is extended and where the second connection pipe 8 extends in the direction in which the tubular member 61 on the other end side of the heat transfer pipe 6 is extended, the present invention is not limited to this. The first connection pipe 7 and the second connection pipe 8 may be extended in a direction different from the direction in which the tubular member 61 of the heat transfer pipe 6 is extended.

Although Embodiment 1 deals with a case where the heating unit 3 and the heat transfer pipe 6 are connected through the first connection pipe 7 and the second connection pipe 8, the present invention is not limited to this. In the thermoelectric power generation device 1A, the first connection pipe 7 and the second connection pipe 8 are not essential elements. For example, the heating unit 3 and the heat transfer pipe 6 may be directly connected to each other without the first connection pipe 7 and the second connection pipe 8. Alternatively, the heating unit 3 and the heat transfer pipe 6 may be connected to each other through an element different from the first connection pipe 7 and the second connection pipe 8.

Embodiment 1 deals with a thermoelectric power generation system 10 having four thermoelectric power generation devices 1A; however, the present invention is not limited to this, as long as the thermoelectric power generation system 10 includes at least one thermoelectric power generation device 1A.

Although Embodiment 1 adopts water as the heat medium and the coolant, the present invention is not limited to this. The heat medium and the coolant may be different. Any heat medium may be adopted provided that the heat medium can change its phase between gas and liquid in the circulation path 9. Any given coolant may be adopted provided that cooling is possible.

Embodiment 2

[Overall Structure]

A thermoelectric power generation device related to Embodiment 2 of the present invention is described. It should be noted that Embodiment 2 mainly describes differences from Embodiment 1. In Embodiment 2, the same symbols are given to structures identical or similar to those of Embodiment 1. Further, the description of Embodiment 2 omits descriptions which overlaps with that of Embodiment 1.

Figure 6:
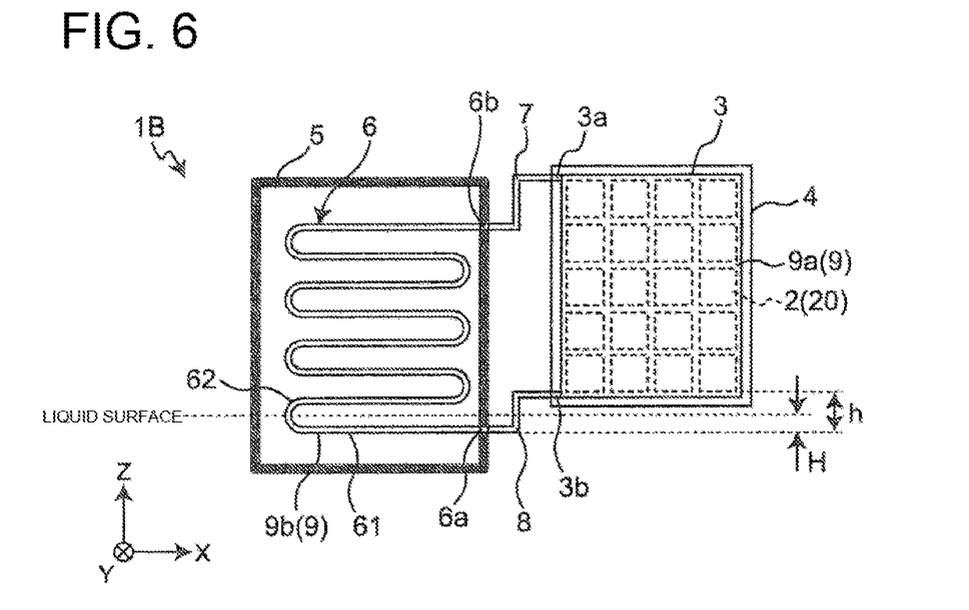
FIG. 6 is a diagram showing a schematic structure of a thermoelectric power generation device related to Embodiment 2 of the present invention.

FIG. 6 shows a schematic structure of a thermoelectric power generation device 1B related to Embodiment 2.

Embodiment 2 is different from Embodiment 1 in that the outlet 3b of the heating unit 3 is provided in a position higher than the inlet 6a of the heat transfer pipe 6 by connecting a bent second connection pipe 8 to the outlet 3b of the heating unit 3 and the inlet 6a of the heat transfer pipe 6.

As shown in FIG. 6, the thermoelectric power generation device 1B adopts a bent second connection pipe 8 to position the outlet 3b of the heating unit 3 higher than the inlet 6a of the heat transfer pipe 6. In Embodiment 2, the second connection pipe 8 is connected to the outlet 3b of the heating unit 3 by bending the second connection pipe 8 extended in the direction (X direction) of extending the heat transfer pipe 6 to the height direction (Z direction). In Embodiment 2, the outlet 3b of the heating unit 3 is provided on a side portion of the heating unit 3, at a position lower than the lowermost end portion of the thermoelectric element 2. The position of the outlet 3b of the heating unit 3 is not limited as long as it is in a position lower than the lowermost end portion of the thermoelectric element 2. For example, the outlet 3b may be provided at a bottom portion of the heating unit 3.

In Embodiment 2, the second connection pipe 8 is formed by bending the second connection pipe 8 extended in the direction (X direction) of extending the heat transfer pipe 6 perpendicularly to the height direction (Z direction), and then further bending the second connection pipe 8 to the X direction. With this second connection pipe 8 having the bent shape as described above, the outlet 3b of the heating unit 3 can be provided at a position higher than the inlet 6a of the heat transfer pipe 6. In Embodiment 2, the first connection pipe 7 may be one that has a similar shape to the second connection pipe 8.

[Effects]

The thermoelectric power generation device 1B related to Embodiment 2 brings about the following effects.

The thermoelectric power generation device 1B has the outlet 3b of the heating unit 3 positioned higher than the inlet 6a of the heat transfer pipe 6. With this structure, a distance h from the lowermost end of the heat transfer pipe 6 to the outlet 3b of the heating unit 3 is made greater than a distance H from the lowermost end of the heat transfer pipe 6 to the liquid surface (liquid level) of the heat medium, when viewed from the Y direction. In the present description, the liquid surface of the heat medium means a boundary between the liquid heat medium flowing in the heat transfer pipe 6 and the heat medium in the form of vapor.

With this structure, the heat medium condensed in the internal space 9a of the heating unit 3 is easily discharged to the heat transfer pipe 6 through the second connection pipe 8. Therefore, retention of the condensed heat medium in the internal space 9a of the heating unit 3 can be suppressed or reduced. Therefore, an increase in the resistance to transfer of heat to the thermoelectric element 2 due to condensed heat medium can be suppressed or reduced, and the thermoelectric element 2 can generate power without being inhibited by the condensed heat medium. As the result, the thermoelectric power generation device 1B can improve the power generation efficiency.

Since members each having a shape similar to each other can be used as the first connection pipe 7 and the second connection pipe 8 of the thermoelectric power generation device 1B, the manufacturing costs can be reduced.

Although Embodiment 2 deals with a case where the second connection pipe 8 is perpendicularly bent to the Z direction, the present invention is not limited to this. In the thermoelectric power generation device 1B, the shape of the second connection pipe 8 is not limited as long as the outlet 3b of the heating unit 3 is positioned higher than the inlet 6a of the heat transfer pipe 6. For example, the second connection pipe 8 may have a shape extending obliquely from the outlet 3b of the heating unit 3 toward the inlet 6a of the heat transfer pipe 6, or an arc shape or the like.

Although Embodiment 2 deals with a case where the first connection pipe 7 has a shape similar to the shape of the second connection pipe 8, the present invention is not limited to this. The shape of the first connection pipe 7 is not limited as long as it connects the outlet 6b of the heat transfer pipe 6 and the inlet 3a of the heating unit 3.

Figure 7:
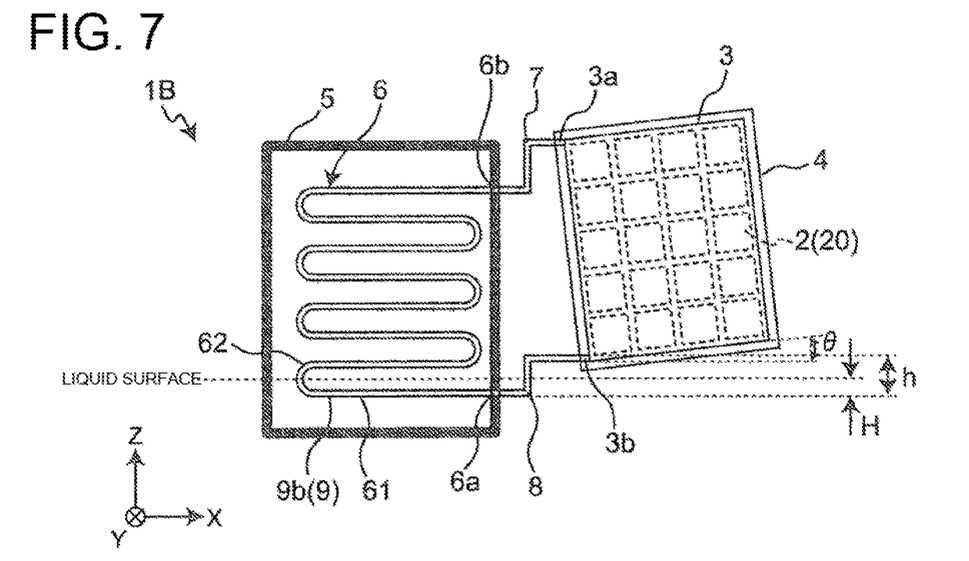
FIG. 7 is a diagram showing a schematic structure of a modification of the thermoelectric power generation device related to Embodiment 2 of the present invention.

FIG. 7 shows a schematic structure of a modification of the thermoelectric power generation device 1B. As shown in FIG. 7, a slope for causing the heat medium to flow towards the outlet 3b of the heating unit 3 may be provided to the bottom portion of the heating unit 3. That is, in Embodiment 2 similarly to Embodiment 1, the heating unit 3 is inclined in the direction of gravity so that the lower end of the heating unit 3 on the side of the heat transfer pipe 6 is lower than the lower end of the heating unit 3 on side opposite to the heat transfer pipe 6, when viewed from the Y direction. With this structure, the heat medium condensed in the heating unit 3 easily flows to the outlet 3b of the heating unit 3. Therefore, the condensed heat medium can be easily discharged to the heat transfer pipe 6.

Embodiment 3

[Overall Structure]

A thermoelectric power generation device related to Embodiment 3 of the present invention is described. It should be noted that Embodiment 3 mainly describes differences from Embodiment 2. In Embodiment 3, the same symbols are given to structures identical or similar to those of Embodiment 2. Further, the description of Embodiment 3 omits descriptions which overlaps with that of Embodiment 2.

Figure 8:
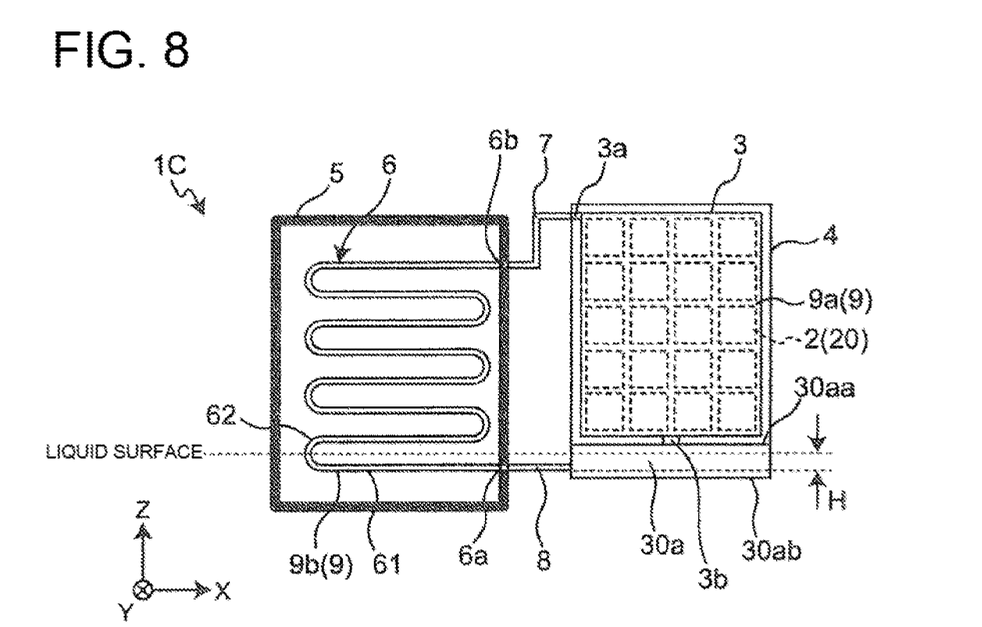
FIG. 8 is a diagram showing a schematic structure of a thermoelectric power generation device related to Embodiment 3 of the present invention.

FIG. 8 shows a schematic structure of a thermoelectric power generation device 1C related to Embodiment 3.

Embodiment 3 is different from Embodiment 2 in that a liquid reservoir 30a for storing the heat medium condensed in the heating unit 3 is provided to a lower portion of the heating unit 3.

As shown in FIG. 8, the thermoelectric power generation device 1C has a liquid reservoir 30a in the lower portion of the heating unit 3. The liquid reservoir 30a is a tank for storing the liquid heat medium condensed in the heating unit 3. The liquid reservoir 30a is connected to the outlet 3b of the heating unit 3. Further, the liquid reservoir 30a is connected to the inlet 6a of the heat transfer pipe 6 through the second connection pipe 8.

In Embodiment 3, the outlet 3b of the heating unit 3 is provided to the bottom portion of the heating unit 3, and is connected to the upper portion of the liquid reservoir 30a. Further, the inlet 6a of the heat transfer pipe 6 is connected to a side portion of the liquid reservoir 30a through the second connection pipe 8 extended in the direction (X direction) in which the heat transfer pipe 6 is extended. With this, the inlet 6a of the heat transfer pipe 6 can be arranged between an upper surface 30aa and an under surface 30ab of the liquid reservoir 30a. That is, the liquid reservoir 30a is arranged nearby a liquid level H of the heat medium in the heat transfer pipe 6.

As described, the outlet 3b of the heating unit 3 and the inlet 6a of the heat transfer pipe 6 are connected through the liquid reservoir 30a and the second connection pipe 8. The liquid reservoir 30a can store, in the lower portion of the heating unit 3, the liquid heat medium flowing in from the outlet 3b of the heating unit 3, and discharge the stored heat medium to the inlet 6a of the heat transfer pipe 6 through the second connection pipe 8. The liquid reservoir 30a constitutes a part of the circulation path 9.

[Effects]

The thermoelectric power generation device 1C related to Embodiment 3 brings about the following effects.

In the thermoelectric power generation device 1C, the lower portion of the heating unit 3 has the liquid reservoir 30a for storing the heat medium condensed in the heating unit 3. With this structure, the heat medium condensed in the heating unit 3 can flow to the liquid reservoir 30a. Therefore, retention of the heat medium in the internal space 9a of the heating unit 3 can be suppressed or reduced. Therefore, an increase in the resistance to transfer of heat to the thermoelectric element 2 due to condensed heat medium can be suppressed or reduced, and the thermoelectric element 2 can generate power without being inhibited by the condensed heat medium. As the result, the thermoelectric power generation device 1C can improve the power generation efficiency.

In the thermoelectric power generation device 1C, the inlet 6a of the heat transfer pipe 6 is connected to a side portion of the liquid reservoir 30a through the second connection pipe 8 extended in the direction (X direction) in which the heat transfer pipe 6 is extended. With this structure, the liquid reservoir 30a can be arranged nearby the liquid level of the condensed heat medium flowing in the internal space 9b of the heat transfer pipe 6. Therefore, the heat medium stored in the liquid reservoir 30a can easily flow to the internal space 9b of the heat transfer pipe 6. Therefore, retention of the condensed heat medium in the internal space 9a of the heating unit 3 can be suppressed or reduced.

Although Embodiment 3 deals with a case where the second connection pipe 8 is connected to a side portion of the liquid reservoir 30a, the present invention is not limited to this, as long as the liquid reservoir 30a is arranged so that at least the upper surface 30aa of the liquid reservoir 30a is in a position higher than the inlet 6a of the heat transfer pipe 6. For example, the liquid reservoir 30a may be arranged in an even higher position, and the second connection pipe 8 may be connected to the under surface 30ab of the liquid reservoir 30a. In this case, the second connection pipe 8 is bent upward (in the Z direction) and connected to the under surface 30ab in the bottom portion of the liquid reservoir 30a. With this structure, the heat medium is easily discharged from the liquid reservoir 30a to the heat transfer pipe 6, and a back current of the heat medium from the heat transfer pipe 6 to the liquid reservoir 30a can be suppressed or reduced.

Although Embodiment 3 deals with a case where the outlet 3b of the heating unit 3 is provided to the bottom portion of the heating unit 3, the present invention is not limited to this. The outlet 3b of the heating unit 3 may be provided in a position lower than the lowermost end portion of the thermoelectric element 2, and may be provided on a side portion of the heating unit 3. Further, the outlet 3b of the heating unit 3 and the liquid reservoir 30a may be directly connected, or connected through an element such as a pipe.

Figure 9:
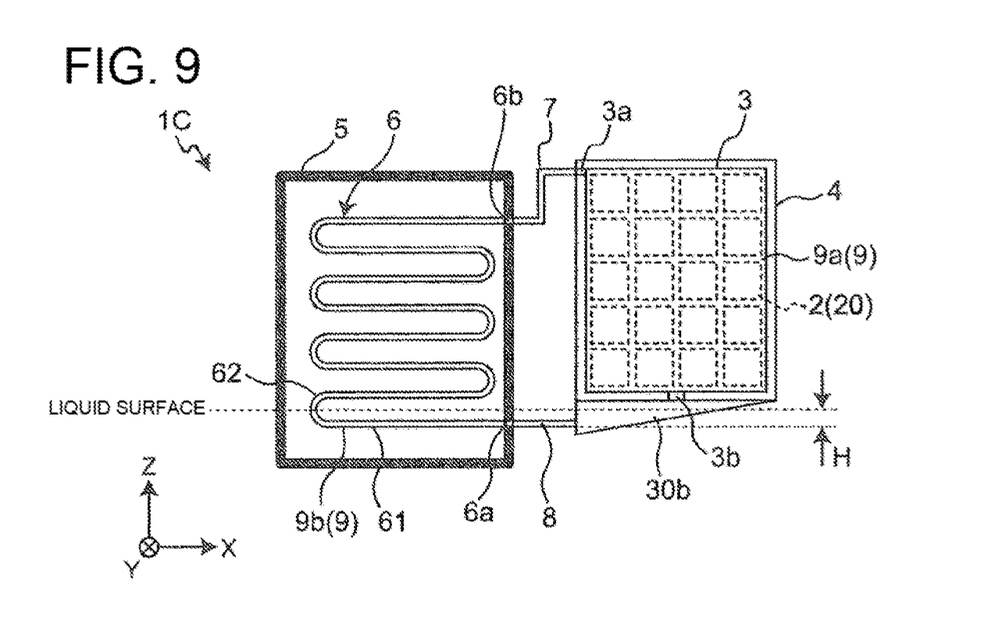
FIG. 9 is a diagram showing a schematic structure of a modification of the thermoelectric power generation device related to Embodiment 3 of the present invention.

FIG. 9 shows a schematic structure of a modification of the thermoelectric power generation device 1C. As shown in FIG. 9, a slope for causing the heat medium to flow towards the inlet 6a of the heat transfer pipe 6 may be provided to the bottom portion of the liquid reservoir 30b. With this structure, the heat medium stored in the liquid reservoir 30b is easily discharged to the heat transfer pipe 6. Therefore, retention of the condensed heat medium in the internal space 9a of the heating unit 3 can be suppressed or reduced.

Embodiment 4

[Overall Structure]

A thermoelectric power generation device related to Embodiment 4 of the present invention is described. It should be noted that Embodiment 4 mainly describes differences from Embodiment 2. In Embodiment 4, the same symbols are given to structures identical or similar to those of Embodiment 2. Further, the description of Embodiment 4 omits descriptions which overlaps with that of Embodiment 2.

Figure 10:
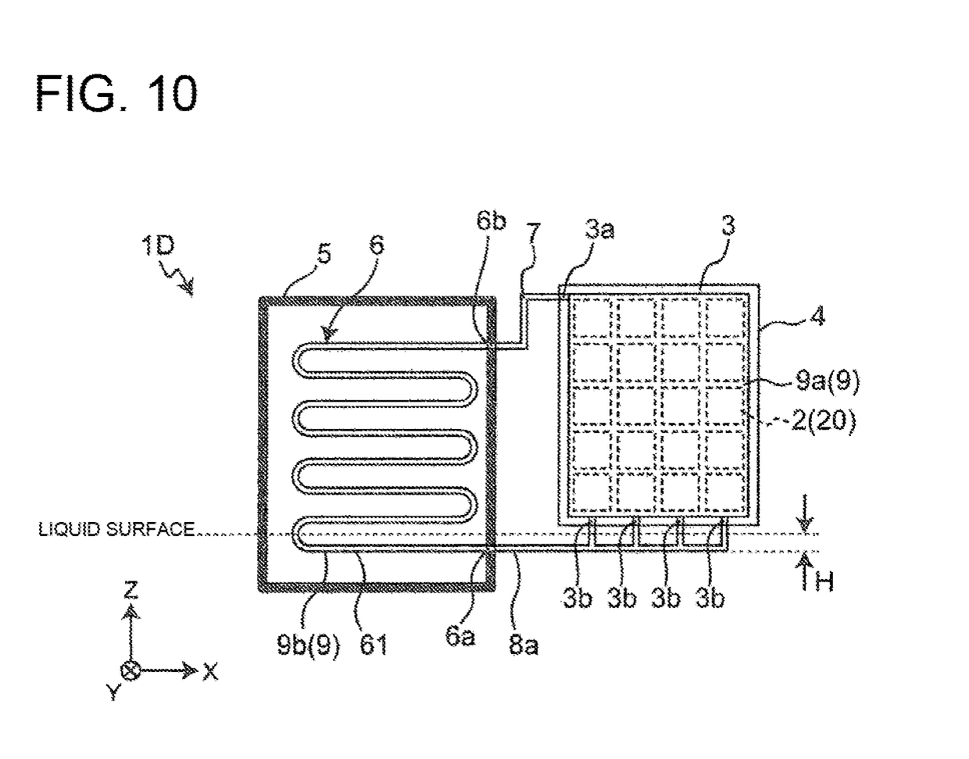
FIG. 10 is a diagram showing a schematic structure of a thermoelectric power generation device related to Embodiment 4 of the present invention.

FIG. 10 shows a schematic structure of a thermoelectric power generation device 1D related to Embodiment 4.

Embodiment 4 is different from Embodiment 2 in that a plurality of outlets 3b are provided to the bottom portion of the heating unit 3.

As shown in FIG. 10, the thermoelectric power generation device 1D has a plurality of outlets 3b provided to the bottom portion of the heating unit 3. The plurality of outlets 3b of the heating unit 3 are connected to the second connection pipe 8a in the lower portion of the heating unit 3.

In Embodiment 4, four outlets 3b are provided to the bottom portion of the heating unit 3. Further, the second connection pipe 8a extend in the X direction from the inlet 6a of the heat transfer pipe 6 and is branched into a plurality of pipes under the heating unit 3. The plurality of pipes extend upward (in the Z direction) and connect to the plurality of outlets 3b of the heating unit 3, respectively.

In Embodiment 4, the plurality of outlets 3b of the heating unit 3 are each provided in a position higher than the inlet 6a of the heat transfer pipe 6. Therefore, the height (height in the Z direction) of each of the plurality of pipes branched off at the other end side of the second connection pipe 8 is higher than the liquid level H of the condensed heat medium flowing in the internal space 9*b* of the heat transfer pipe 6.

[Effects]

The thermoelectric power generation device 1D related to Embodiment 4 brings about the following effects.

In the thermoelectric power generation device 1D, the plurality of outlets 3*b* are provided to the bottom portion of the heating unit 3. The plurality of outlets 3*b* of the heating unit 3 are each provided in a position higher than the inlet 6*a* of the heat transfer pipe 6. The plurality of outlets 3*b* of the heating unit 3 are connected to the inlet 6*a* of the heat transfer pipe 6 through the second connection pipe 8*a* provided below the heating unit 3. With this structure, the heat medium condensed in the heating unit 3 can flow from the plurality of outlets 3*b* of the heating unit 3 to the inlet 6*a* of the heat transfer pipe 6 through the second connection pipe 8*a*. Therefore, retention of the condensed heat medium in the heating unit 3 can be suppressed or reduced. Therefore, an increase in the resistance to transfer of heat to the thermoelectric element 2 due to condensed heat medium can be suppressed or reduced, and the thermoelectric element 2 can generate power without being inhibited by the condensed heat medium. As the result, the thermoelectric power generation device 1D can improve the power generation efficiency.

Although Embodiment 4 describes a case where four outlets 3*b* are provided to the bottom portion of the heating unit 3, the present invention is not limited to this, provided that two or more outlets 3*b* are provided to the bottom portion of the heating unit 3. Further, the plurality of outlets 3*b* of the heating unit 3 may partially be provided to a side portion of the heating unit 3.

In Embodiment 4, the plurality of pipes provided on the other end side of the second connection pipe 8 may have, for example, a bent shape or an arc shape.

Although each of the above embodiments describes the present invention with a certain level of details, the details of the structures disclosed in these embodiments are modifiable. Further, modification in combinations and arrangement of elements in each embodiment are possible without departing from the scope and spirit of the present disclosure.

INDUSTRIAL APPLICABILITY

The present invention is applicable to a thermoelectric power generation device in which a heat medium is circulated in a circulation path formed inside a heating unit and a heat source unit by having the heat medium alternately vaporized and condensed, thereby heating a thermoelectric element.

REFERENCE SIGNS LIST 1A, 1B, 1C, 1D thermoelectric power generation device
2 thermoelectric element
3 heating unit
3*a* inlet
3*b* outlet
4 cooling unit
40 coolant passage
41 coolant inflow pipe
42 coolant discharge pipe
5 passage
6 heat transfer pipe
6*a* inlet
6*b* outlet
61 tubular member
62 bent portion
7 first connection pipe
8, 8*a* second connection pipe
9 circulation path
10 thermoelectric power generation system
11 inverter
12 electric load
13 tank
14 vacuum pump
15 heat exchanger
16 cooling installation
20 thermoelectric module
30*a*, 30*b* liquid reservoir
30*aa* upper surface
30*ab* under surface
L1, L2, L3 heat medium line
L4, L5 coolant line

The invention claimed is:

1. A thermoelectric power generation device comprising:
a thermoelectric element having a first side provided on an external surface of a body of a heating unit and a second side provided on a cooling unit; and
a heat transfer pipe arranged in a passage in which a high temperature fluid flows; and
a reservoir coupled to a lower portion of the heating unit and connected in fluid flow communication to an outlet of the heating unit and to an inlet of the heat transfer pipe,
wherein
the heating unit and the heat transfer pipe respectively have internal spaces, configured to communicate with each other, the body of the heating unit enclosing the internal space of the heating unit,
the internal space of the heating unit and the internal space of the heat transfer pipe form a circulation path in which a heat medium is circulated,
an outlet of the heat transfer pipe from which the heat medium is discharged is provided in a position higher than the inlet of the heat transfer pipe into which the heat medium flows, wherein a portion of the heat transfer pipe is surrounded by the high temperature fluid, the portion extending from the inlet of the heat transfer pipe to the outlet of the heat transfer pipe, and wherein the inlet and the outlet of the heat transfer pipe are each connected to the heating unit,
the inlet of the heat transfer pipe is provided in a position lower than a lowermost end portion of the thermoelectric element,
the heat transfer pipe is configured to vaporize the heat medium flowing in the circulation path by using heat of the high temperature fluid,
the heating unit is configured to condense the heat medium vaporized,
the reservoir is configured to store the heat medium condensed by the heating unit and received from the outlet of the heating unit into the reservoir, and
a bottom surface of the reservoir includes a slope configured to cause the condensed heat medium stored in the reservoir to flow towards the inlet of the heat transfer pipe.

2. The thermoelectric power generation device according to claim 1, wherein a slope configured to cause the heat medium flowing in the internal space of the heating unit to flow towards an outlet of the heating unit is provided in a bottom portion of the heating unit.

3. The thermoelectric power generation device according to claim 1, wherein an outlet of the heating unit is provided in a position higher than the inlet of the heat transfer pipe.

4. The thermoelectric power generation device according to claim 3, wherein:
the heating unit has a plurality of outlets at a bottom portion of the heating unit, and
a connection pipe configured to connect the plurality of outlets of the heating unit with the inlet of the heat transfer pipe is provided in a lower portion of the heating unit.

5. The thermoelectric power generation device according to claim 1, wherein the body of the heating unit is formed in a plate shape enclosing the internal space through which the heat medium passes.

6. The thermoelectric power generation device according to claim 1, wherein the internal space of the heating unit includes a plurality of passages between a first side of the heating unit and a second side of the heating unit.

7. The thermoelectric power generation device according to claim 6, wherein an internal space of the cooling unit includes a plurality of passages.

8. The thermoelectric power generation device according to claim 7, wherein a first set of the plurality of passages of the cooling unit are perpendicular to the plurality of passages of the heating unit.

9. The thermoelectric power generation device according to claim 8, wherein a second set of the plurality of passages of the cooling unit are parallel to the plurality of passages of the heating unit.

10. The thermoelectric power generation device according to claim 1, wherein the heat transfer pipe defines a single flow path for the heat medium from the inlet of the heat transfer pipe to the outlet of the heat transfer pipe.

11. The thermoelectric power generation device according to claim 10, wherein the heat medium flows in a first direction through a first portion of the single flow path and in a second direction through a second portion of the single flow path, and wherein the first direction is opposite the second direction.

12. The thermoelectric power generation device according to claim 1, wherein the heat medium flows into the inlet of the heat transfer pipe in a first direction and is discharged from the outlet of the heat transfer pipe in a second direction, and wherein the first direction is opposite the second direction.

13. The thermoelectric power generation device according to claim 1, wherein an outlet of the cooling unit is provided in a position higher than an inlet of the cooling unit when the thermoelectric power generation device is in operation.

14. The thermoelectric power generation device according to claim 1, wherein the heat transfer pipe is elongated in a single continuous pipe from the inlet of the heat transfer pipe to the outlet of the heat transfer pipe.

15. The thermoelectric power generation device according to claim 14, wherein the heat transfer pipe includes a plurality of bends along the single continuous pipe.

16. The thermoelectric power generation device according to claim 1, wherein the thermoelectric element, the heating unit, and the cooling unit are arranged such that a horizontal plane extends through each of the thermoelectric element, the heating unit, and the cooling unit.

17. The thermoelectric power generation device according to claim 1, wherein the high temperature fluid flows through an entirety of the passage around the portion of the heat transfer pipe.

18. The thermoelectric power generation device according to claim 1, wherein the portion of the heat transfer pipe defines a single flow path such that the outlet of the heat transfer pipe is a single outlet from the passage that defines a flow path for the high temperature fluid.

* * * * *